US011700700B2

(12) United States Patent
Chen et al.

(10) Patent No.: US 11,700,700 B2
(45) Date of Patent: Jul. 11, 2023

(54) COMPOSITE LATCH COVER

(71) Applicant: QUANTA COMPUTER INC., Taoyuan (TW)

(72) Inventors: Chao-Jung Chen, Taoyuan (TW); Hou-Hsien Chang, Taoyuan (TW)

(73) Assignee: QUANTA COMPUTER, INC., Taoyuan (TW)

( * ) Notice: Subject to any disclaimer, the term of this patent is extended or adjusted under 35 U.S.C. 154(b) by 1065 days.

(21) Appl. No.: 16/285,989

(22) Filed: Feb. 26, 2019

(65) Prior Publication Data
US 2020/0037457 A1 Jan. 30, 2020

Related U.S. Application Data

(60) Provisional application No. 62/703,213, filed on Jul. 25, 2018.

(51) Int. Cl.
*H05K 5/02* (2006.01)
(52) U.S. Cl.
CPC ...... *H05K 5/0221* (2013.01); *E05Y 2800/674* (2013.01); *E05Y 2900/606* (2013.01)
(58) Field of Classification Search
None
See application file for complete search history.

(56) References Cited

U.S. PATENT DOCUMENTS

| 1,175,603 A | 3/1916 | Clausen | |
| 9,681,574 B1* | 6/2017 | Chen | H05K 7/1489 |
| 10,349,547 B1* | 7/2019 | Ayala Vera | H05K 7/1488 |
| 2005/0052828 A1* | 3/2005 | Chang | G06F 1/181 |
| | | | 361/679.02 |
| 2005/0104486 A1* | 5/2005 | Huang | H05K 5/0013 |
| | | | 312/223.2 |
| 2007/0194021 A1* | 8/2007 | Liang | G06F 1/181 |
| | | | 220/4.21 |
| 2009/0102334 A1 | 4/2009 | Chen et al. | |

(Continued)

FOREIGN PATENT DOCUMENTS

JP 2000013046 A 1/2000

OTHER PUBLICATIONS

Extended European Search Report for EP Application No. 19176265.7, dated Dec. 11, 2019.

(Continued)

*Primary Examiner* — James Wu
*Assistant Examiner* — Christopher L Augustin
(74) *Attorney, Agent, or Firm* — Nixon Peabody LLP

(57) ABSTRACT

A latching apparatus has a first component and a second component. The first component is made of a first material and includes a distal end, a proximal end, and an indention between the distal end the proximal end. The distal end includes a mating tab, whereas the proximal end includes a flange member for fixing the first component to a lid of a housing. The second component is made of a second material and is coupled to the mating tab. The second component includes a receiving element for engaging with a securing element of the housing. The latching element includes a pressing region formed in one of the first component and the second component between the indention and the receiving element. The first material has a higher flexibility that the second material.

18 Claims, 5 Drawing Sheets

(56) References Cited

U.S. PATENT DOCUMENTS

| | | | |
|---|---|---|---|
| 2013/0094156 A1* | 4/2013 | Wang | G06F 1/188 |
| | | | 361/747 |
| 2013/0279123 A1* | 10/2013 | Lin | H05K 7/1487 |
| | | | 361/747 |
| 2014/0062273 A1* | 3/2014 | Lee | H05K 5/0221 |
| | | | 403/14 |

OTHER PUBLICATIONS

JP Office Action for Application No. 2019-121267, dated Jun. 2, 2020, w/ First Office Action Summary.

* cited by examiner

COMPOSITE LATCH COVER

CROSS-REFERENCE TO RELATED APPLICATIONS

This application claims priority to and the benefit of U.S. Provisional Application No. 62/703,213, entitled, "Composite Enhanced Cover Latch," and filed Jul. 25, 2018, the contents of which are hereby incorporated by reference in their entirety as if fully set forth herein.

FIELD

The present disclosure generally relates to a latching apparatus that secures a lid apparatus to a chassis.

BACKGROUND

A typical data center has thousands of physical rack structures, each with vertically oriented slots or chassis that may house multiple devices. Typical housed devices in a rack structure include servers, switches, and storage devices. Some data centers have tens of thousands of servers, attendant storage devices, and network switches.

For operational convenience and flexibility, each server component is typically "hot plug" connected within the rack structure. This type of electrical connection permits any of the electronic components to be removed and re-installed within the support housing without disturbing the operation of the other server components. A typical latch mechanism is used to secure a server component within the rack structure. The typical latch mechanism is designed to be engaged and disengaged to remove and reinstall the electrical component within the support housing. Often, the typical latch mechanism is designed and cut from sheet-metal due to cost efficiencies. However, sheet metal is relatively thin and not structurally strong. Therefore, when the rack structure and its housed servers, attendant storage devices, and network switches undergo shock and vibration testing, the latch mechanisms tend to fail.

In response, latch mechanisms have been designed with greater thickness than traditional sheet metal to withstand the shock and vibration testing. However, the increased thickness impacts the ease of the release component to engage and disengage the latch mechanism. The present disclosure provides an improved latch mechanism that will not accidentally disengage when undergoing shock and vibration testing, while still providing ease of use for engaging and disengaging when pressing the release component.

SUMMARY

The various examples of the present disclosure are directed towards a latching apparatus with a first component and a second component. The first component is made of a first material and includes a distal end, a proximal end, and an indention between the distal end the proximal end. The distal end includes a mating tab, whereas the proximal end includes a flange member for fixing the first component to a lid of a housing. The second component is made of a second material and is coupled to the mating tab. The second component includes a receiving element for engaging with a securing element of the housing. The latching element includes a pressing region formed in either the first component or the second component. The pressing region can be located between the indention and the receiving element. The first material has a higher flexibility than the second material.

In some embodiments, the first component can be made from aluminum, sheet-metal, plastic, or some combination thereof. In some examples, the second component and the securing element of the housing can be made from stainless steel, mild steel, cast iron with an electroless nickel coating, or some combination thereof. In some embodiments, the securing element of the housing can include a tab or hook feature. The second component can include a receiving element located on the mating tab. The receiving element can include threading configured to receive a screw to secure the first component to the second component.

In some embodiments, the flange member can be secured to the lid of the housing by way of removable connectors or fasteners, such as nuts and bolts, screws, or the like. In some embodiments, the second component can include an attachment element located on the opposite side of the mating tab and configured to engage with a ridge element of the housing. The pressing region can include an impressed surface.

Other various examples of the present disclosure are directed towards a housing apparatus. The housing apparatus can include a securing element, a lid element, and a latching apparatus. As described above, the latching apparatus can include a first component and a second component. The first component is made of a first material and includes a distal end, a proximal end, and an indention between the distal end the proximal end. The distal end includes a mating tab, whereas the proximal end includes a flange member for fixing the first component to a lid of a housing. The second component is made of a second material and is coupled to the mating tab. The second component includes a receiving element for engaging with a securing element of the housing. The latching element includes a pressing region formed in one of the first component and the second component between the indention and the receiving element. The first material has a higher flexibility that the second material.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1:
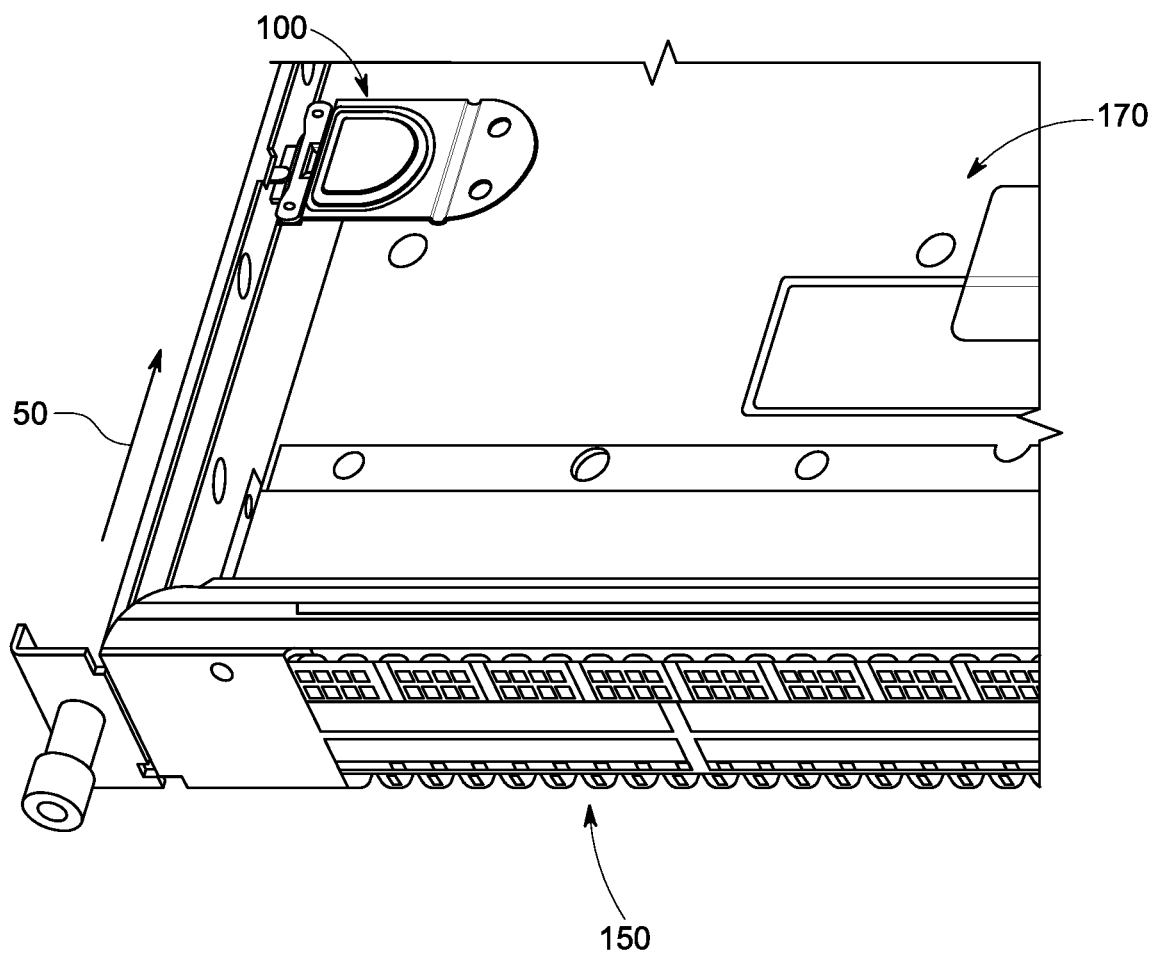
FIG. 1 shows an exemplary system component and top cover being inserted onto the system component, according to an embodiment of the present disclosure.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides a latching apparatus with a first component and a second component. The first component is made of a first material and includes a distal end, a proximal end, and an indention between the distal end the proximal end. The distal end includes a mating tab, whereas the proximal end includes a flange member for fixing the first component to a lid of a housing. The second component is made of a second material and is coupled to the mating tab. The second component includes a receiving element for engaging with a securing element of the housing. The latching element includes a pressing region formed in either the first component or the second component. The pressing region can be located between the indention and the receiving element. The first material has a higher flexibility than the second material.

FIG. 1 shows an exemplary chassis 150. The chassis 150 can have a lid 170 (shown in transparency) that can be slid onto the chassis 150 in direction 50. For exemplary purposes, the chassis 150 can include a server, a switch device, or a storage device. A latch mechanism 100 can be attached to the lid 170, to secure the lid 170 to the chassis 150. In some embodiments, the latch mechanism 100 can be fixed to the lid 170 using removable connectors or fasteners, such as nuts and bolts, screws, or the like. The chassis 150 can include a mating piece (not shown) that connects to the latch mechanism 100. This is discussed below in greater detail with respect to FIGS. 2 through 5. Upon sliding the lid 170 onto the chassis 150, the latch mechanism 100 will come in contact with the mating piece. This connection between the latch mechanism 100 and the mating piece of the chassis 150 secures the lid 170 onto the chassis 150. A person of ordinary skill in the art would appreciate that the latch mechanism 100 can be implemented on other system components, outside of a chassis.

Figure 2:
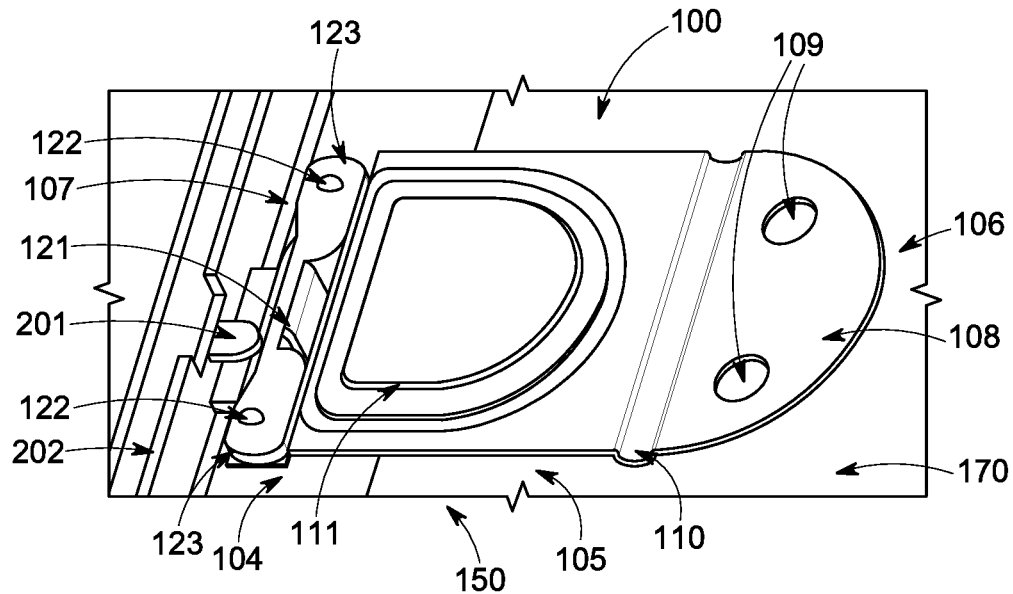
FIG. 2 shows an exemplary latching apparatus securing the system component of FIG. 1, according to an embodiment of the present disclosure.

FIG. 2 shows an exemplary latch mechanism 100 facilitating a connection between the lid 170 and the chassis 150. The latch mechanism 100 can have a flexible component 105 and a rigid component 107. In some embodiments, the flexible component 105 can be made from stainless steel, plastic, or any material configured to withstand varying increased temperatures and deform with applied pressure. The rigid component 107 can be made from sheet-metal, or cast iron with an electroless nickel coating. It should be understood that the rigid component 107 can be made from any material that is cost effective, and achieves high levels of hardness and corrosion resistance. The rigid component 107 can be configured to receive a securing element 201 of the chassis 150. The securing element 201 can be a hook or a tab feature. The securing element 201 can be made from the same material as the rigid component 107 to ensure high levels of hardness and corrosion resistance. Furthermore, the rigidness of both components ensures a secured mating such that the latch mechanism 100 is able to withstand any shock or vibration testing. The rigid component 107 is discussed in greater detail below with respect to FIG. 3.

Figure 3:
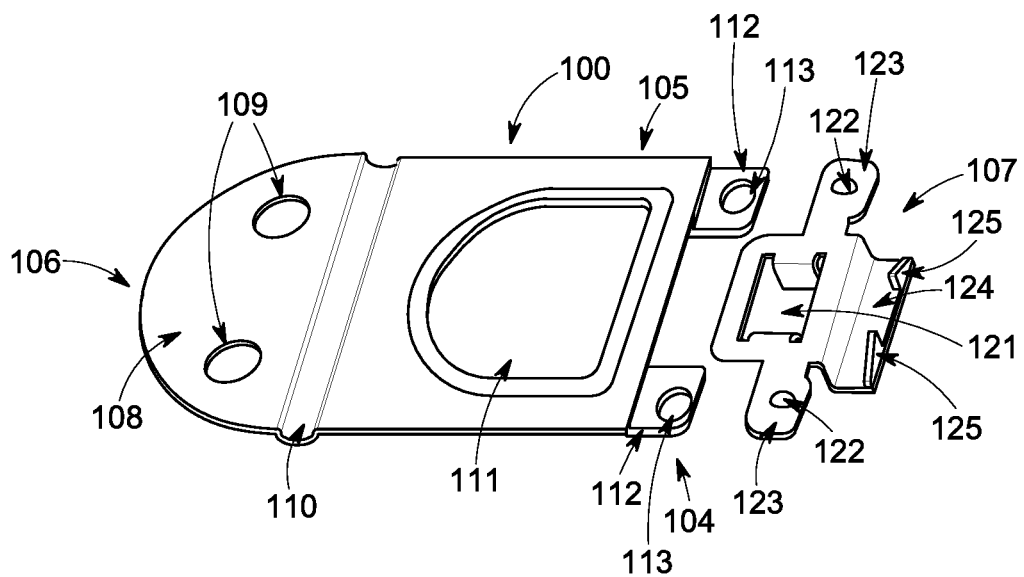
FIG. 3 shows an exploded view of the latching apparatus and its components, according to an embodiment of the present disclosure.

Referring momentarily to the exploded view of the latch mechanism 100 in FIG. 3, the rigid component 107 can have multiple features to ensure a secured connection to the chassis 150 and the lid 170. Specifically, the rigid component 107 can have a receiving element 121. The receiving element 121 can be an aperture configured to the dimensions of the securing element 201 of the chassis 150 (shown in FIGS. 2 and 5). For example, where the securing element 201 includes a rectangular shape, the receiving element 121 can be designed to receive the rectangular securing element 201. The receiving element 121 and the securing element 201 can be designed with minimal tolerance to ensure a secured connection between the latch mechanism 100 and the chassis 150.

Figure 4:
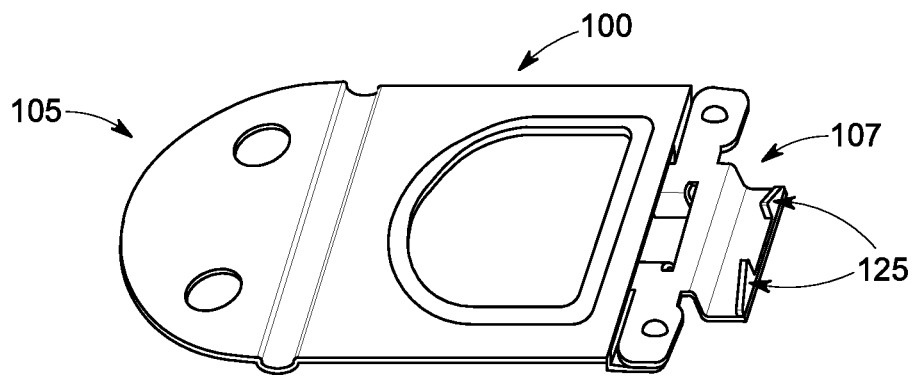
FIG. 4 shows an assembled view of the latching apparatus and its components, according to an embodiment of the present disclosure.

The rigid component 107 can also include receiving elements 122. Each of the receiving elements 122 can be located on a tab 123 extending from the rigid component 107. Each of the receiving elements 122 can be configured to receive a screw to secure the rigid component 107 to the flexible component 105. The flexible component 105 can have a proximal end 106 and a distal end 104. The distal end 104 of the flexible component 105 can include mating tabs 112. The mating tabs 112 can each include apertures 113. The apertures 113 located on the flexible component 105 can be aligned with the receiving elements 122 of the rigid component 107, such that the two components are mated together using any connectors or fasteners, such as nuts and bolts, screws, or the like. The assembled latch mechanism 100 is shown in FIG. 4.

Referring back to FIG. 2, the proximal end 106 of the flexible component 105 can have a flange member 108. The flange member 108 can include at least one aperture 109. The aperture 109 can be configured to receive a screw to secure the latch mechanism 100 to the lid 170. In some embodiment, the flange member 108 contains two equal sized apertures 109. Any number of apertures 109 can be implemented herein to secure the flange member 108 to the lid 170. Furthermore, the flange member 108 can be secured to the lid 170 using any connectors or fasteners, such as nuts and bolts, screws, or the like.

Figure 7A:
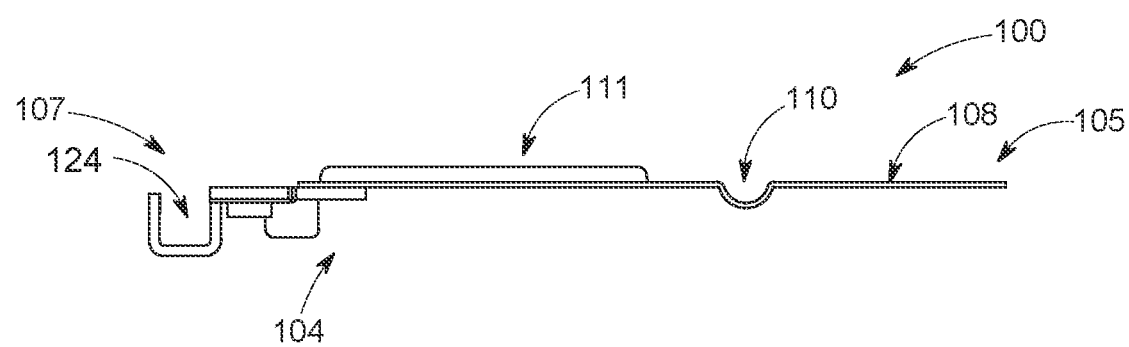
FIG. 7A shows a side view of the latching apparatus and its components in the non-flexed position, according to an embodiment of the present disclosure.
Figure 7B:
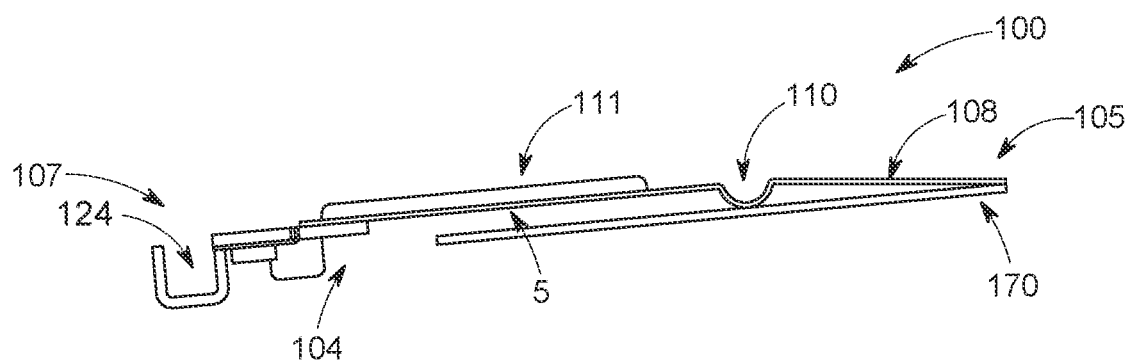
FIG. 7B shows a side view of the latching apparatus and its components in the flexed position, according to an embodiment of the present disclosure.

Referring momentarily to the side views of the latch mechanism 100 in FIGS. 7A and 7B, the flexible component 105 can also include a pressing region 111 at the distal end 104. The pressing region 111 can include an impressed surface. FIG. 7A shows the latch mechanism 100 in the non-flexed position. The flexible component 105 can include a hinge. For the purposes of this example, the hinge is indicated as an indention 110. However, it should be understood that the hinge can be any configuration of a solid flexible hinge that serves as a leverage point to disengage the latch mechanism 100 from the securing element of the chassis (not shown), once the pressing region 111 is pressed. FIG. 7B shows the latch mechanism 100 in the flexed position. In the flexed position, the fastening of the flange member 108 to the chassis causes at least a portion of the flange member 108 to become parallel with the lid 170. As a result, the indention 110 causes the distal end 104 to be separated by a nominal space 5 from the lid 170. This nominal space 5 creates enough force to secure the securing element of the chassis (not shown) within the receiving element 121 of the rigid component 107.

Figure 5:
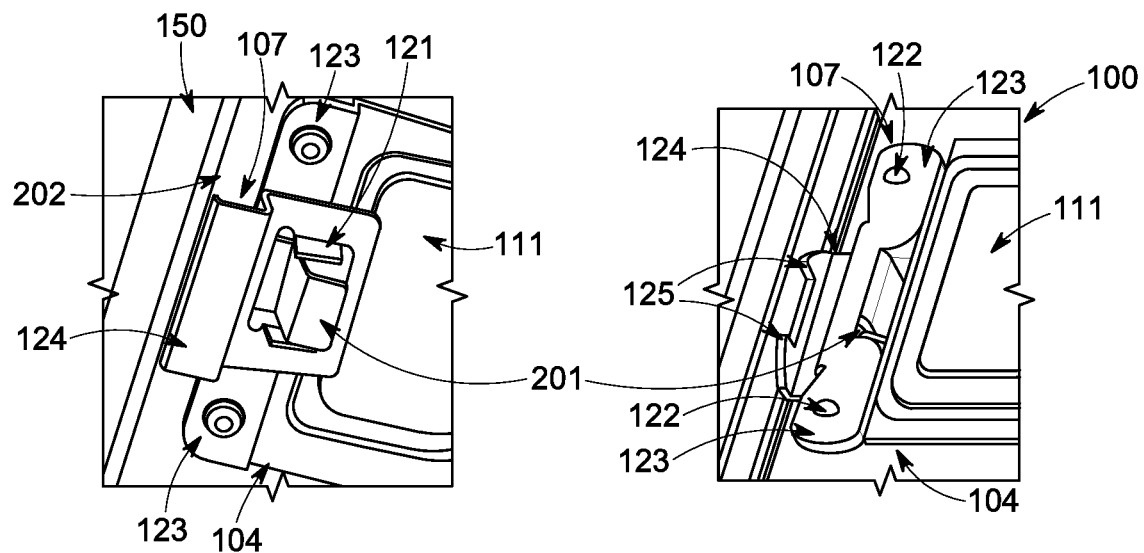
FIG. 5 shows the latching apparatus securing the lid to the system component of FIG. 1, according to an embodiment of the present disclosure.

Referring momentarily to FIG. 5, the rigid component 107 can further include an attachment element 124 opposite of the receiving element 121. The attachment element 124 can include tab features 125. The tab features 125 can be configured to secure the rigid component 107 to mating features (not shown) of the chassis 150. The attachment element 124 can be on a different plane than the tabs 123. The attachment element 124 can attach to a ridge 202 of the chassis 150.

Referring back to FIG. 2, once the pressing region 111 of the flexible component 105 is pressed, it drives the distal end 104 of the flexible component 105 towards the lid 170. It should be understood that the function of latch mechanism 100 can be achieved without the pressing region 111. The latch mechanism 100 need only contain an area configured to receive force to disengage or engage via the indention 110. Because the indention 110 serves as the leverage point of the latch mechanism only the indention 110 of the latch mechanism 100 is made from a flexible material. This is discussed in greater detail with respect to FIGS. 6A, 6B and 6C.

Figure 6A:
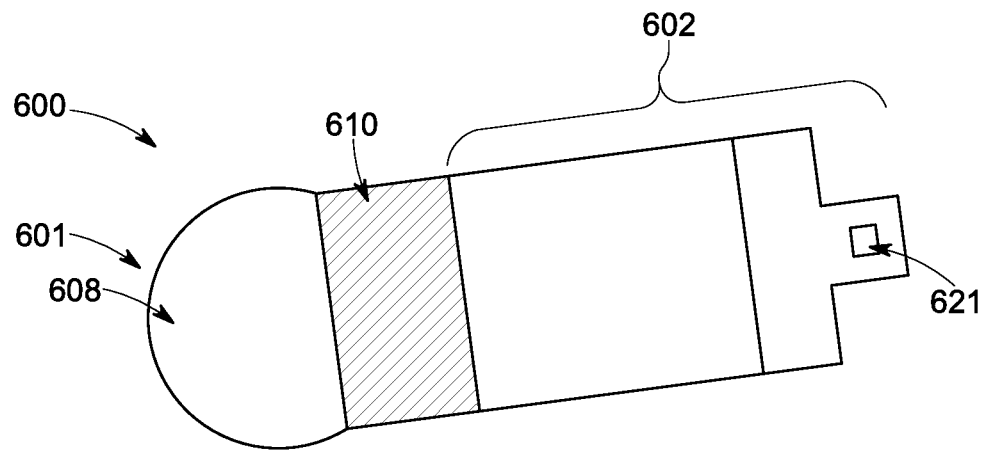
FIG. 6A exemplifies alternative embodiments of the latch mechanism and the various compositions.
Figure 6B:
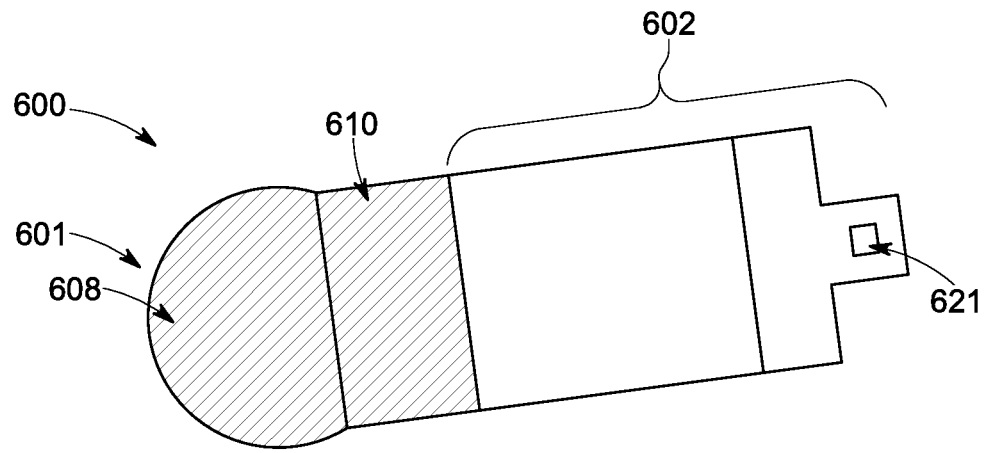
FIG. 6B exemplifies alternative embodiments of the latch mechanism and the various compositions.
Figure 6C:
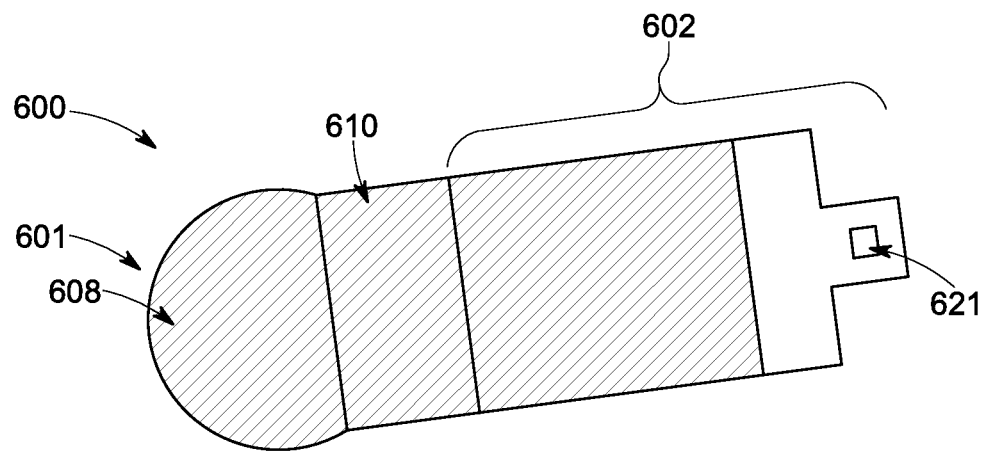
FIG. 6C exemplifies alternative embodiments of the latch mechanism and the various compositions.

FIGS. 6A, 6B, and 6C exemplify alternative embodiments of the latch mechanism and the various compositions. FIG. 6A illustrates a latch mechanism 600 with a distal end 601 and a proximal end 602. The distal end 601 can have a flange member 608 that is similar to the flange member 108 of FIG. 2. The proximal end 602 can have a receiving element 621 that is similar to the receiving element 121 of FIG. 2. The latch mechanism 600 can also have an indention 610 similar to the indention 110 of FIG. 2. In the latch mechanism 600, of FIG. 6A, the indention 610 can be made up of flexible material, as described above with respect to FIG. 2. The remaining body of the latch mechanism 600, including the flange member 608 and the proximal end 602, can be made from a rigid material, as described above with respect to FIG. 2.

FIG. 6B illustrates an exemplary embodiment where the indention 610 and the distal end 601 are made up of flexible material. The proximal end 602 can be made of a rigid material. This includes, for example, the receiving element 621. In contrast, FIG. 6C illustrates an exemplary embodiment where the indention 610, the flange member 608, and a significant section of the proximal end 602 are made up of a flexible material. This configuration is described in detail above with respect to FIGS. 1 through 5.

Referring back to FIG. 2, once the pressing region 111 of the flexible component 105 is pressed, the distal end 104 of the flexible component 105 is driven towards the lid 170 of the chassis 150. The mating of the two surfaces creates enough space to cause a separation of the securing element 201 and the receiving element 121. Referring momentarily to FIG. 5, the mating of the two surfaces also creates enough space to cause a separation of the ridge 202 and the attachment element 124. This separation causes the latch mechanism 100 to be disengaged from the chassis 150. The plasticity of the flexible component 105 allows for a simple compression of the pressing region 111 to release the latch mechanism 100, while the stiffness of the rigid component 107 ensures a secured mating between the latch mechanism 100 and the chassis 150.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations, and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A computing system comprising:
   a chassis configured to house a computing device in an internal space and including a securing element;
   a lid movably attached to the chassis to cover or uncover the internal space; and
   a latch mechanism attached to the lid for securing the lid to the chassis, the latch mechanism being attached on an external surface of the lid and including a first component of a first material and comprising a distal end, a proximal end, and an indention between the distal end and the proximal end, the distal end comprising a mating tab, the proximal end comprising a flange member for fixing the first component to the lid at least a distal portion of the distal end being generally in a same plane with at least a proximal portion of the proximal end in an un-flexed position of the first component, the distal portion being generally in a different plane relative to the proximal portion in a flexed position of the first component, the indention being separated from the lid in the un-flexed position, the indention being in direct contact with the lid in the flexed position and causing the distal end to be separated from the lid by a nominal space, the direct contact between the indention and the lid providing a leverage point for creating a sufficient force to secure the lid to the chassis;

a second component of a second material is coupled to the mating tab and including a receiving element for engaging with the securing element of the chassis; and a pressing region formed on a surface of the first component between the indention and the mating tab, the pressing region being defined by an impressed outline that completely surrounds an impressed surface, the impressed outline extending away from the surface of the first component and separating the impressed surface from a remaining area of the surface of the first component;

wherein the first material has a higher flexibility than the second material.

2. The computing system of claim 1, wherein the first component comprises at least one of: aluminum, sheet-metal, plastic, and a combination thereof.

3. The computing system of claim 1, wherein the second component comprises at least one of: stainless steel, mild steel, cast iron with an electroless nickel coating, and a combination thereof.

4. The computing system of claim 1, wherein the securing element of the chassis comprises at least one of a tab feature and a hook feature.

5. The computing system of claim 1, wherein the securing element of the housing comprises at least one of: stainless steel, mild steel, cast iron with an electroless nickel coating, and a combination thereof.

6. The computing system of claim 1, wherein the receiving element is located on the mating tab.

7. The computing system of claim 6, wherein the receiving element comprises threading configured to receive a screw to secure the first component to the second component.

8. The computing system of claim 1, wherein the flange member is secured to the lid of the housing via at least one of a nut, screw, connector, and fastener.

9. The computing system of claim 1, wherein the second component further includes an attachment element opposite of the mating tab, and configured to engage with a ridge element of the chassis.

10. A housing apparatus for a computing device, the housing apparatus comprising:
a securing element;
a lid element; and
a latching apparatus secured to the lid element, the latching apparatus comprising:
a first component of a first material and comprising a distal end, a proximal end, and an indention between the distal end and the proximal end, the distal end comprising a mating tab, the proximal end comprising a flange member for fixing the first component to the lid element, at least a distal portion of the distal end being generally in a same plane with at least a proximal portion of the proximal end in an un-flexed position of the first component, the distal portion being generally in a different plane relative to the proximal portion in a flexed position of the first component, the indention being separated from the lid element in the un-flexed position, the indention being in direct contact with the lid element in the flexed position and causing the distal end to be separated from the lid element by a nominal space, the direct contact between the indention and the lid element providing a leverage point for creating a sufficient force to secure the lid element to the securing element;

a second component of a second material and coupled to the mating tab and comprising a receiving element for engaging with the securing element; and a pressing region formed on a surface of the first component between the indention and the mating tab, the pressing region being defined by an impressed outline that completely surrounds an impressed surface, the impressed outline extending away from the surface of the first component and separating the impressed surface from a remaining area of the surface of the first component, wherein the first material has a higher flexibility than the second material.

11. The housing apparatus of claim 10, wherein the first component comprises at least one of: aluminum, sheet-metal, plastic, and a combination thereof.

12. The housing apparatus of claim 10, wherein the second component comprises at least one of: stainless steel, mild steel, cast iron with an electroless nickel coating, and a combination thereof.

13. The housing apparatus of claim 10, wherein the securing element of the housing comprises at least one of a tab feature and a hook feature.

14. The housing apparatus of claim 10, wherein the securing element of the housing comprises at least one of: stainless steel, mild steel, cast iron with an electroless nickel coating, and a combination thereof.

15. The housing apparatus of claim 10, wherein the receiving element is located on the mating tab.

16. The housing apparatus of claim 15, wherein the receiving element comprises threading configured to receive a screw to secure the first component to the second component.

17. The housing apparatus of claim 10, wherein the flange member is secured to the lid element via at least one of a nut, screw, connector, and fastener.

18. The housing apparatus of claim 10, wherein the second component further includes an attachment element opposite of the mating tab and configured to engage with a ridge element of the securing element.

* * * * *